United States Patent

Rao

(10) Patent No.: US 9,337,846 B2
(45) Date of Patent: May 10, 2016

(54) METHODS AND SYSTEMS FOR DETERMINING WHETHER A RECEIVER IS PRESENT ON A PCI-EXPRESS BUS

(71) Applicant: Kool Chip, Inc., San Jose, CA (US)

(72) Inventor: Venkata N. S. N. Rao, Fremont, CA (US)

(73) Assignee: SoCtronics, Inc., Santa Clara, CA (US)

( * ) Notice: Subject to any disclaimer, the term of this patent is extended or adjusted under 35 U.S.C. 154(b) by 470 days.

(21) Appl. No.: 13/922,193

(22) Filed: Jun. 19, 2013

(65) Prior Publication Data

US 2014/0317432 A1    Oct. 23, 2014

Related U.S. Application Data

(60) Provisional application No. 61/814,153, filed on Apr. 19, 2013.

(51) Int. Cl.
| | |
|---|---|
| *G06F 13/42* | (2006.01) |
| *H03L 7/00* | (2006.01) |
| *H03K 19/0175* | (2006.01) |
| *G06F 13/38* | (2006.01) |
| *H03L 7/08* | (2006.01) |
| *H03L 7/093* | (2006.01) |
| *H04L 7/00* | (2006.01) |
| *G06F 1/28* | (2006.01) |
| *G06F 1/04* | (2006.01) |
| *G06F 1/10* | (2006.01) |
| *H04L 25/02* | (2006.01) |

(52) U.S. Cl.
CPC .. *H03L 7/00* (2013.01); *G06F 1/04* (2013.01); *G06F 1/10* (2013.01); *G06F 1/28* (2013.01); *G06F 13/385* (2013.01); *H03K 19/0175* (2013.01); *H03K 19/017509* (2013.01); *H03L 7/0802* (2013.01); *H03L 7/093* (2013.01); *H04L 7/0012* (2013.01); *H04L 25/028* (2013.01); *H04L 25/0276* (2013.01)

(58) Field of Classification Search
USPC ........... 710/104–110, 300–311; 713/300–340
See application file for complete search history.

(56) References Cited

U.S. PATENT DOCUMENTS

| | | | | |
|---|---|---|---|---|
| 7,231,480 | B2 * | 6/2007 | Woodral | G06F 13/423 710/302 |
| 7,747,809 | B2 * | 6/2010 | Hanscom | G06F 11/0745 710/309 |
| 8,989,313 | B2 * | 3/2015 | Bergkvist, Jr. | H04B 17/104 375/317 |

* cited by examiner

*Primary Examiner* — Raymond Phan
(74) *Attorney, Agent, or Firm* — Venture Pacific Law, PC

(57) ABSTRACT

A method for detecting a receiver on a computer bus, comprises the steps of: applying a low voltage state on transmission lines of the computer bus using a voltage mode driver; applying a high voltage state on the transmission lines using the voltage mode driver; determining a voltage rate change for transmission voltages on the transmission lines; and determining the presence of the receiver on the computer bus as a function of the voltage rate change.

15 Claims, 5 Drawing Sheets

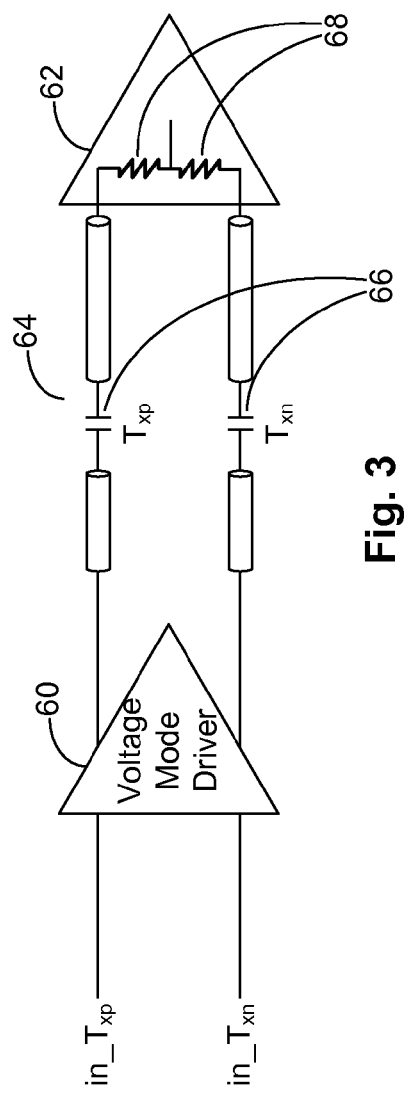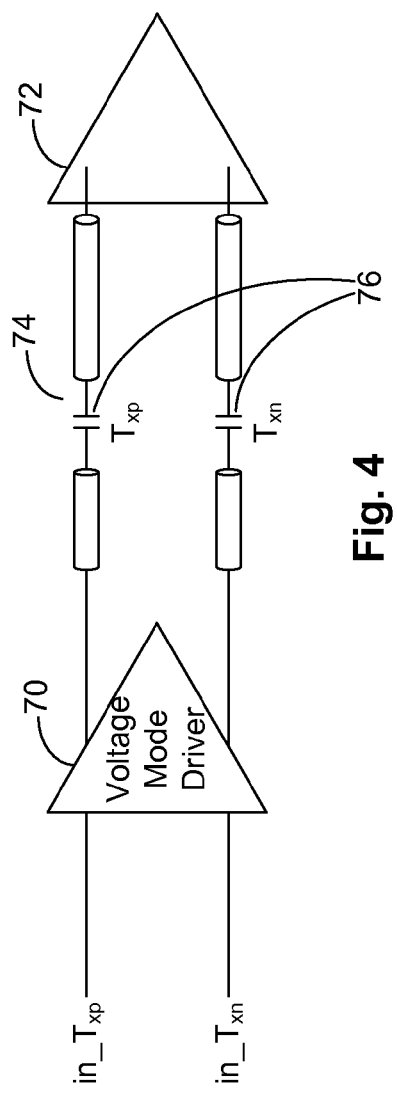
Fig. 3
Fig. 4

US 9,337,846 B2

METHODS AND SYSTEMS FOR DETERMINING WHETHER A RECEIVER IS PRESENT ON A PCI-EXPRESS BUS

CROSS REFERENCE

This application claims priority from a provisional patent application entitled "Apparatuses, Methods, and Systems Using Integrated Circuits" filed on Apr. 19, 2013 and having an Application No. 61/814,153. Said application is incorporated herein by reference.

FIELD OF INVENTION

The present invention generally relates to receiver detection on a computer bus and, in particular, to methods and systems for detecting a receiver on a Peripheral Component Interconnect Express bus.

BACKGROUND

The Peripheral Component Interconnect Express ("PCI-Express") standard defines how one or more peripheral devices can communicate with a computing device over a serial bus link. The serial bus link can be within a single computing device or can link one or more computing devices and peripheral devices. PCI-Express uses discrete logical layers to process inbound and outbound information. For instance, PCI-Express devices receive serial data, align the serial data and then convert the serial data into parallel data. PCI-Express devices use PCI-Express core logic for interfacing with host systems. The PCI-Express core logic includes a control status module ("PCS module") that has a serial/deserializer ("SERDES") and other components. The SERDES in the PCS module communicates with a SERDES in a host system. However, before the SERDES in the PCS module can communicate with a SERDES in the host system, the PCS module detects if a receiver (i.e. the SERDES in the host system) is present and/or available to receive data.

In conventional systems, a SERDES vendor provides the mechanism to detect if a receiver is present. Often, the mechanism provided indicates that a receiver is present by using specific receiver detection protocol incorporating a set frequency, for example, 3 to 15 kilohertz if a receiver is present or above 30 kilohertz is a receiver is not present. Such proprietary conventional techniques have shortcomings. For example, detecting a receiver at a frequency of 3 kilohertz may cause delay and may take too long.

In addition, another prior art method and apparatus for detecting a receiver over a PCI-Express bus is to adjust a common mode voltage by current injection using a charge pump into one or more transmitter output nodes and detecting whether a receiver is present based on a voltage change rate. The current is injected by a charge pump under control of an amplitude control circuit. The charge pump consumes large amounts of power, and thus this prior art method is not appropriate for low power applications. Therefore, there is a need for a low power method and system to perform the receiver detection efficiently.

SUMMARY OF INVENTION

An object of this invention is to provide low power methods and systems for receiver detection on a computer bus.

Another object of this invention is to provide methods and systems for receiver detection on a PCI-Express bus using a voltage mode driver.

Yet another object of this invention is to provide methods and systems for receiver detection that have safeguards to prevent a voltage on a computer bus from exceeding a protocol dictated maximum common mode voltage.

Briefly, the present invention discloses methods and systems for detecting a receiver on a computer bus, comprising the steps of: applying a low voltage state on transmission lines of the computer bus using a voltage mode driver; applying a high voltage state on the transmission lines using the voltage mode driver; determining a voltage rate change for transmission voltages on the transmission lines; and determining the presence of the receiver on the computer bus as a function of the voltage rate change.

An advantage of this invention is that low power methods and systems for receiver detection on a computer bus are provided.

Another advantage of this invention is that methods and systems for receiver detection on a PCI-Express bus using a voltage mode driver are provided.

Yet another advantage of this invention is that methods and systems for receiver detection that have safeguards to prevent a voltage on a computer bus from exceeding a protocol dictated maximum common mode voltage are provided.

DESCRIPTION OF THE DRAWINGS

The foregoing and other objects, aspects, and advantages of the invention can be better understood from the following detailed description of the preferred embodiment of the invention when taken in conjunction with the accompanying drawings in which:

FIG. 3 illustrates a diagram for an equivalent circuit of a computer bus when a receiver is present.

FIG. 4 illustrates a diagram for an equivalent circuit of a computer bus when a receiver is not present.

DETAILED DESCRIPTION OF THE PREFERRED EMBODIMENTS

In the following detailed description of the embodiments, reference is made to the accompanying drawings, which form a part hereof, and in which is shown by way of illustration of specific embodiments in which the present invention may be practiced.

Generally, methods and systems are provided for detecting a receiver over a PCI-Express link (or any other computer bus standard or protocol). A receiver can be detected on a PCI-Express link by bringing the common mode voltage of a voltage mode driver for the PCI-Express link to a low voltage state, e.g., by pulling the differential outputs of the voltage mode driver low. Once the low voltage state is detected on both differential outputs, a pulse signal can be applied via the voltage mode driver to bring the common mode voltage to a high voltage state. The differential outputs of the voltage mode driver can be compared to one or more predefined reference voltages. The time between applying the pulse signal and the time the differential outputs reach the one or more predefined reference voltages can be used to determine whether there is a receiver on the PCI-Express link.

Figure 1:
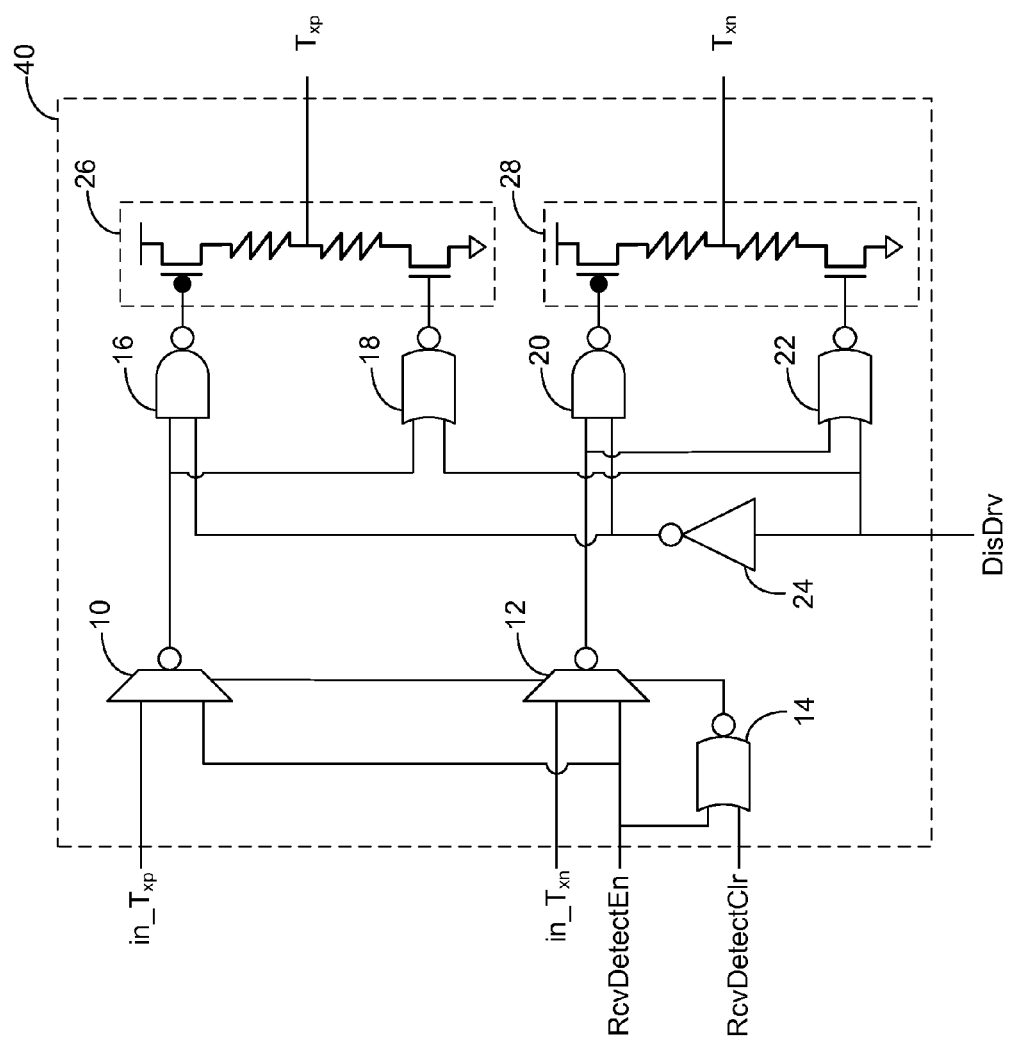
FIG. 1 illustrates a diagram of a voltage mode driver of the present invention for detecting a receiver on a computer bus.

FIG. 1 illustrates a diagram of a voltage mode driver of the present invention for detecting a receiver on a computer bus. A voltage mode driver of the present invention 40 comprises multiplexers 10 and 12, NAND gates 16 and 20, NOR gates 14, 18, and 22, inverter 24, control input signals, and driver cells 26 and 28. The driver cell 26 comprises a PMOS transistor, two resistors, and an NMOS transistor serially connected to generate a positive output $T_{xp}$ for the transmission lines of the PCI-Express link. The driver cell 28 comprises a PMOS transistor, two resistors, and an NMOS transistor serially connected to generate a negative output $T_{xn}$ for the transmission lines of the PCI-Express link. The positive output $T_{xp}$ and the negative output $T_{xn}$ can also be referred to as the transmission voltages for the transmission lines of the PCI-Express link.

The controls signals RcvDetectEn, RcvDetectClr, and Dis-Drv are inputted to the voltage mode driver 40 via the multiplexers 10 and 12, NAND gates 16 and 20, NOR gates 14, 18, and 22, inverter 24 to control the output of the voltage mode driver 40. A positive input voltage in_$T_{xp}$ and the RcvDetectEn signal are inputted to the multiplexer 10, which is controlled by the output of the NOR gate 14. The not output of the multiplexer 10 is inputted to the NAND gate 16 and the NOR gate 18. A negative input voltage in_$T_{xn}$ and the RcvDetectEn signal are inputted to the multiplexer 12, which is controlled by the output of the NOR gate 14. The not output of the multiplexer 12 is inputted to the NAND gate 20 and the NOR gate 22. The RcvDetectEn signal and the RcvDetectClr signal is inputted to the NOR gate 14.

The DisDrv signal is inputted to the inverter 24 and the NOR gates 18 and 22. The inverter 24 output is inputted to the NAND gates 16 and 20. The NAND gate 16 drives the gate of the PMOS transistor of the driver cell 26. The NOR gate 18 drives the gate of the NMOS transistor of the driver cell 26. The NAND gate 20 drives the gate of the PMOS transistor of the driver cell 28. The NOR gate 22 drives the gate of the NMOS transistor of the driver cell 28.

When the RcvDetectEn signal is low and the RcvDetectClr signal is high, the transmission voltages $T_{xp}$ and $T_{xn}$ are both driven low. When the RcvDetectEn signal is high and the RcvDetectClr signal is high, then the transmission voltages $T_{xp}$ and $T_{xn}$ are both driven high. When the DisDrv signal is high, then the voltage mode driver 40 is tri-stated, and effectively disabled.

In normal operation (e.g., when the RcvDetectClr, RcvDetectEn, and DisDrv signals are low), the multiplexer 10 is enabled so that the input signal in_$T_{xp}$ for the differential transmission line is directed to the output $T_{xp}$ of the voltage mode driver 40. The multiplexer 12 is also enabled so that the input signal in_$T_{xn}$ for the differential transmission line is directed to the output $T_{xn}$ of the voltage mode driver 40.

Figure 2:
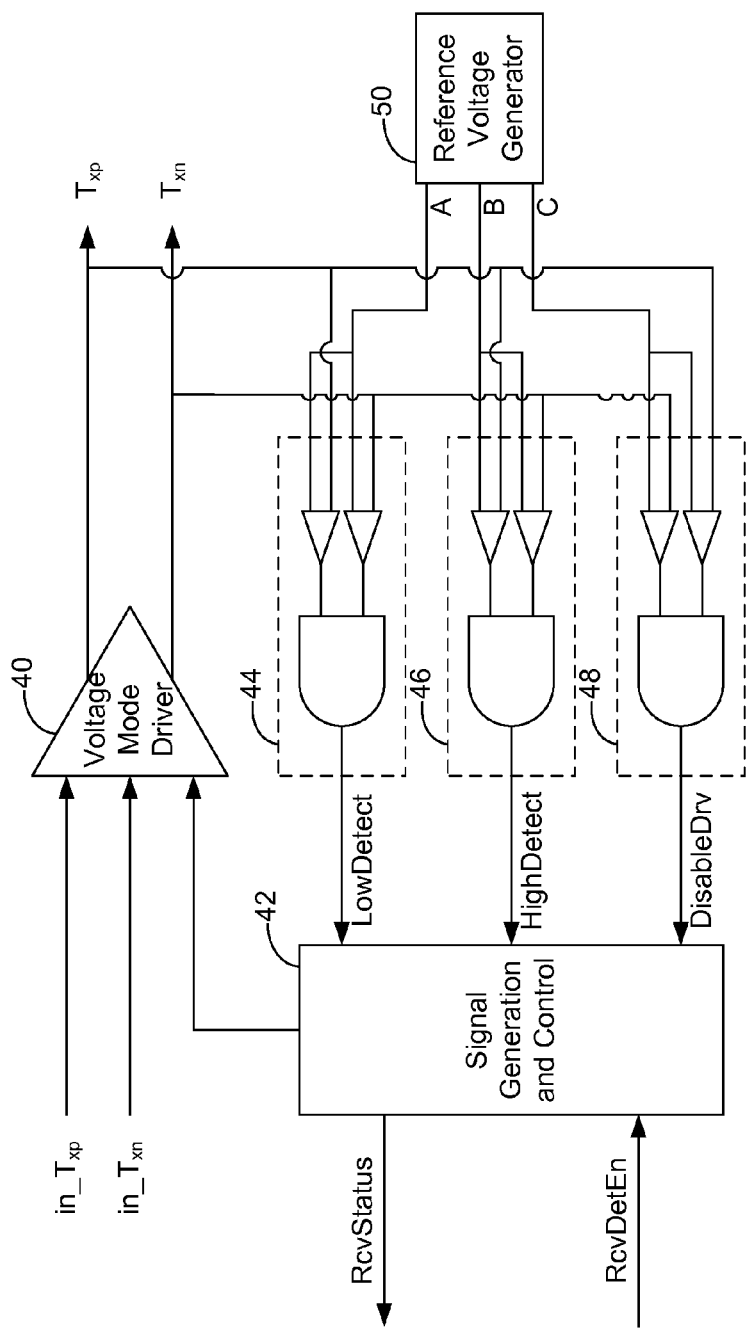
FIG. 2 illustrates a diagram for a receiver detection system of the present invention.

FIG. 2 illustrates a diagram for a receiver detection system of the present invention. The receiver detection system of the present invention comprises the voltage mode driver 40, a signal generation and control unit 42, a low detect logic 44, a high detect logic 46, a disable drive logic 48, and a reference voltage generator 50. The low detect logic 44, the high detect logic 46, and the disable drive logic 48 monitor the transmission voltages $T_{xp}$ and $T_{xn}$. The signal generation and control unit 42 transmits the control signals RcvDetectEn, RcvDetectClr, and DisDrv to the voltage mode driver 40 based upon the results of the monitored transmission voltages $T_{xp}$ and $T_{xn}$.

A host controller (not shown) can assert the control signal RcvDetEn to the signal generation and control unit 42 to start the receiver detection system. Upon receiving the RcvDetEn signal, the signal generation and control unit 42 drives the RcvDetectClr signal high and the RcvDetectEn signal low, which is inputted to the voltage mode driver 40. The voltage mode driver 40 then brings down the transmission voltages $T_{xp}$ and $T_{xn}$ low.

The low detect logic 44 comprises a summing circuit and comparators that compare the transmission voltages $T_{xp}$ and $T_{xn}$ to a reference voltage A (e.g., 100 mV). The reference voltage A is generated by the reference voltage generator 50 and can be adjusted as desired. When the low detect logic 44 detects that the transmission voltages $T_{xp}$ and $T_{xn}$ are both below the reference voltage A, the low detect logic 44 signals this occurrence to the signal generation and control unit 42 via a LowDetect signal. The signal generation and control unit 42 then drives the transmission voltages $T_{xp}$ and $T_{xn}$ to high by outputting a high signal for the control signal RcvDetectEn.

The high detect logic 46 comprises a summing circuit and comparators that compare the transmission voltages $T_{xp}$ and $T_{xn}$ with a reference voltage B (e.g., 600 mV). The reference voltage B is generated by the reference voltage generator 50 and can be adjusted as desired. As the transmission voltages $T_{xp}$ and $T_{xn}$ are driven high, the high detect logic 46 detects when the signals $T_{xp}$ and $T_{xn}$ both exceed the reference voltage B. This occurrence is reported to the signal generation and control unit 42 to estimate the amount of time (which can be measured in clock cycles or in nanoseconds) it takes to raise the transmission voltages $T_{xp}$ and $T_{xn}$ from the reference voltage A to the reference voltage B.

The disable drive logic 48 comprises a summing circuit and comparators that compare the transmission voltages $T_{xp}$ and $T_{xn}$ with a reference voltage C (e.g., 700 mV). The reference voltage C is generated by the reference voltage generator 50 and can be adjusted as desired. Due to specific protocols and standards for the computer bus, the computer bus may have a stated maximum common mode voltage. The disable drive logic 48 detects whether or not the transmission voltages $T_{xp}$ and $T_{xn}$ exceed the reference voltage C, which can be set to this stated maximum common mode voltage or below the maximum common mode voltage to allow for some margin of error. If so, then the voltage mode driver 40 is disabled.

Operationally, the receiver detection system can begin by asserting a high signal for the control signal RcvDetEn. Upon receiving the control signal RcvDetEn, the signal generation and control unit 42 asserts the RcvDetectClr signal to the voltage mode driver 40. The voltage mode driver 40 then pulls the transmission voltages $T_{xp}$ and $T_{xn}$ low. The low detect logic 44 determines whether the transmission voltages $T_{xp}$ and $T_{xn}$ is below the predefined reference voltage A. If the transmission voltages $T_{xp}$ and $T_{xn}$ are below the reference voltage A, the low detect logic 44 asserts a LowDetect signal to the signal generation and control unit 42. The signal generation and control unit 42 then asserts the RcvDetectEn signal to the voltage mode driver 40. The RcvDetectEn signal is inputted to the voltage mode driver 40 to drive the transmission voltages $T_{xp}$ and $T_{xn}$ high. The high detect logic 46 monitors whether the transmission voltages $T_{xp}$ and $T_{xn}$ have reached or exceeded the predefined reference voltage B, which is programmable. If the transmission voltages $T_{xp}$ and $T_{xn}$ are above the reference voltage B, then a HighDetect signal is asserted to the signal generation and control unit 42.

The signal generation and control unit 42 checks the delay between the RcvDetectEn and HighDetect signal assertions. If the delay is less than or equal to a programmable value, T1, then the receiver is not present. Else, the receiver is present. The disable driver logic 48 determines whether the transmission voltages $T_{xp}$ and $T_{xn}$ have reached the predefined reference voltage C, which is programmable. If the transmission voltages $T_{xp}$ and $T_{xn}$ both exceed the reference voltage C, then a signal DisableDrv is asserted to the signal generation and control unit 42. The signal generation and control unit 42 in turn disables the voltage mode driver 40 by enabling the DisDrv signal. This is to make sure the transmission voltages $T_{xp}$ and $T_{xn}$ are always less than the protocol dictated maximum common mode voltage. If the signal generation and control unit 42 determines that there is a receiver on the transmission line, then the signal RcvStatus is reported to the controller.

FIG. 3 illustrates a diagram for an equivalent circuit for a computer bus when a receiver is present. A voltage mode driver 60 of the present invention and a receiver 62 communicate over a differential transmission line 64, e.g., a PCI-Express link. AC coupling between the voltage mode driver 60 and the receiver 62 is characterized through the coupling capacitors 66. The transmission line 64 can be inputted to the voltage mode driver 60 from a transmitter that communicates over the differential transmission line 64. The voltage mode driver 60 can adjust the voltage signals $T_{xp}$ and $T_{xn}$ on the differential transmission line 64 for output to the receiver 62.

If the receiver 62 is present and connected to the differential transmission line 64, then the resistors 68 can terminate the differential transmission line 64 by being serially connected across the differential transmission line 64.

If the present invention recognizes that when the receiver 64 is present and connected to the transmission line 64, large AC coupling capacitors 66 will act as a load to the voltage mode driver 60. If the voltage mode driver 60 applies a high signal on the differential transmission line 64, the transmission voltages $T_{xp}$ and $T_{xn}$ at the differential transmission line 64 will slowly rise due to the receiver 62 being connected to the differential transmission line 64.

FIG. 4 illustrates a diagram for an equivalent circuit for a computer bus when a receiver is not present. A voltage mode driver 70 of the present invention and a possible receiver 72 communicate over a differential transmission line 74, e.g., a PCI-Express link. AC coupling between the voltage mode driver 70 and the receiver 72 is characterized through coupling capacitors 76. The differential transmission line 74 can be inputted to the voltage mode driver 70 from a transmitter that communicates over the differential transmission line 74. The voltage mode driver 70 can adjust the transmission voltages $T_{xp}$ and $T_{xn}$ on the differential transmission line 74 for output to the receiver 72.

If the receiver 72 is not present and/or not connected to the differential transmission line 74, then the differential transmission line 74 does not have a terminating resistor at the receiver 72.

When the receiver 72 is not present and/or not connected to the transmission line 74, large AC coupling capacitors 76 will act as a load to the voltage mode driver 70. If the voltage mode driver 70 applies a high signal on the differential transmission line 74, the transmission voltages $T_{xp}$ and $T_{xn}$ at the differential transmission line 74 will quickly rise on the differential transmission line 64 when the receiver is not present and/or not connected to the transmission line 74.

Figure 5:
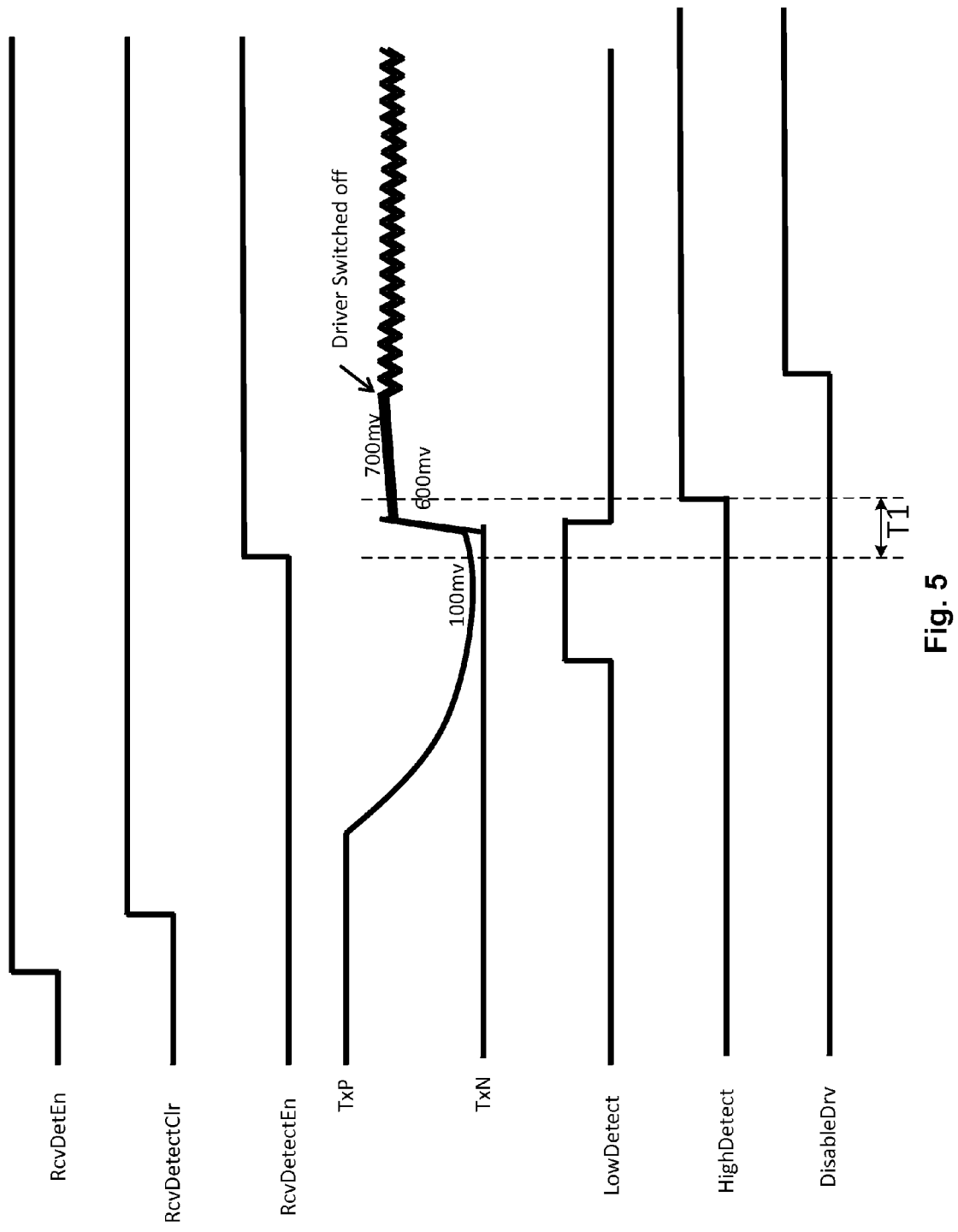
FIG. 5 illustrates a waveform of various signals for a receiver detection system of the present invention when a receiver is not present on a computer bus.

FIG. 5 illustrates a waveform of various signals of a receiver detection system of the present invention when a receiver is not present on a computer bus. When the receiver is not present, the transmission voltages $T_{xp}$ and $T_{xn}$ quickly exceed a predefined voltage, e.g., 700 mV, within a short time frame. The receiver detection system can determine the amount of time T1 for the transmission voltages $T_{xp}$ and $T_{xn}$ to reach the predefined voltage. If the time T1 is within a predefined amount of time, then the receiver detection system can signal that a receiver is not present.

Figure 6:
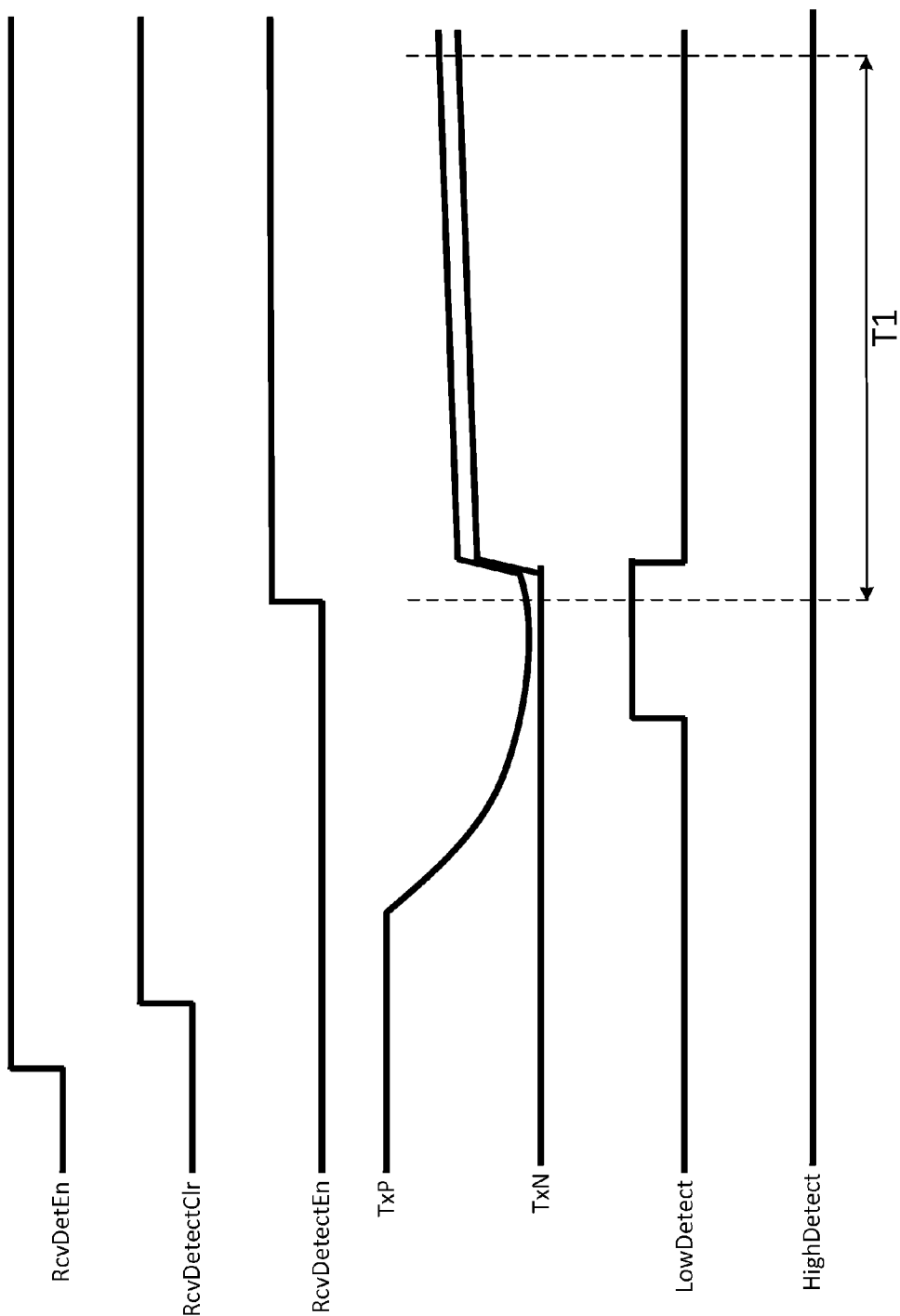
FIG. 6 illustrates a waveform of various signals for a receiver detection system of the present invention when a receiver is not present on a computer bus.

FIG. 6 illustrates a waveform of various signals of a receiver detection system of the present invention when a receiver is not present on a computer bus. When the receiver is present, the transmission voltages $T_{xp}$ and $T_{xn}$ slowly rise to the predefined voltage, e.g., 700 mV, taking a relatively long amount of time to reach the predefined voltage. The receiver detection system can determine the amount of time T1 for the transmission voltages $T_{xp}$ and $T_{xn}$ to reach the predefined voltage or come close to the predefined voltage. If the time T1 exceeds a predefined time frame for detecting the receiver, then the receiver detection system can signal that a receiver is present.

While the present invention has been described with reference to certain preferred embodiments or methods, it is to be understood that the present invention is not limited to such specific embodiments or methods. Rather, it is the inventor's contention that the invention be understood and construed in its broadest meaning as reflected by the following claims. Thus, these claims are to be understood as incorporating not only the preferred methods described herein but all those other and further alterations and modifications as would be apparent to those of ordinary skilled in the art.

I claim:

1. A method for detecting a receiver on a computer bus, comprising the steps of:
    applying a low voltage state on transmission lines of the computer bus using a voltage mode driver;
    applying a high voltage state on the transmission lines using the voltage mode driver;
    determining a voltage rate change for transmission voltages on the transmission lines; and
    determining the presence of the receiver on the computer bus as a function of the voltage rate change,
    wherein the voltage mode driver comprises multiplexers, NAND gates, NOR gates, an inverter, and driver unit cells, and
    wherein the voltage mode driver receives a differential input signal and outputs to the transmission lines according to controls signals.

2. The method of claim 1 wherein the transmission voltages are monitored by a low detect logic to indicate when the transmission voltages are below a first reference voltage.

3. The method of claim 1 wherein the transmission voltages are monitored by a high detect logic to indicate when the transmission voltages exceed a second reference voltage.

4. The method of claim 1 wherein the transmission voltages are monitored by a disable drive logic to signal when the transmission voltages exceed a third reference voltage.

5. The method of claim 1 wherein the control signals comprise the following: a DisDrv signal that tri-states the voltage mode driver, a RcvDetectEn signal to set the transmission voltages to a high state or low state, and a RcvDetectClr signal to enable the voltage mode driver.

6. The method of claim 2 in the applying the high voltage state step, wherein the high voltage state is applied when the transmission voltages are below the first reference voltage.

7. The method of claim 3 in the determining the voltage rate change step, wherein the voltage rate change is an amount of time for the transmission voltages to reach the second reference voltage from a first reference voltage.

8. The method of claim 4 wherein the voltage mode driver is disabled when the transmission voltages exceed the third reference voltage.

9. A method for detecting a receiver on a computer bus, comprising the steps of:

applying a low voltage state on transmission lines of the computer bus using a voltage mode driver;

applying a high voltage state on the transmission lines using the voltage mode driver;

determining a voltage rate change for transmission voltages on the transmission lines, wherein the transmission voltages are monitored by a low detect logic to indicate when the transmission voltages are below a first reference voltage and wherein the transmission voltages are monitored by a high detect logic to indicate when the transmission voltages exceed a second reference voltage; and determining the presence of the receiver on the computer bus as a function of the voltage rate change, wherein the voltage mode driver comprises multiplexers, NAND gates, NOR gates, an inverter, and driver unit cells, and wherein the voltage mode driver receives a differential input signal and outputs to the transmission lines according to controls signals.

10. The method of claim 9 in the applying the high voltage state step, wherein the high voltage state is applied when the transmission voltages are below the first reference voltage.

11. The method of claim 9 in the determining the voltage rate change step, wherein the voltage rate change is an amount of time for the transmission voltages to reach the second reference voltage from a first reference voltage.

12. The method of claim 9 wherein the transmission voltages are monitored by a disable drive logic to signal when the transmission voltages exceed a third reference voltage.

13. The method of claim 9 wherein the control signals comprise the following: a DisDrv signal that tri-states the voltage mode driver, a RcvDetectEn signal to set the transmission voltages to a high state or low state, and a RcvDetectClr signal to enable the voltage mode driver.

14. The method of claim 12 wherein the voltage mode driver is disabled when the transmission voltages exceed the third reference voltage.

15. A method for detecting a receiver on a computer bus, comprising the steps of:

applying a low voltage state on transmission lines of the computer bus using a voltage mode driver;

applying a high voltage state on the transmission lines using the voltage mode driver;

determining a voltage rate change for transmission voltages on the transmission lines, wherein the transmission voltages are monitored by a low detect logic to indicate when the transmission voltages are below a first reference voltage, wherein the transmission voltages are monitored by a high detect logic to indicate when the transmission voltages exceed a second reference voltage, and wherein the voltage rate change is an amount of time for the transmission voltages to reach the second reference voltage from the first reference voltage; and determining the presence of the receiver on the computer bus as a function of the voltage rate change, wherein the high voltage state is applied when the transmission voltages are below the first reference voltage, wherein the transmission voltages are monitored by a disable drive logic to signal when the transmission voltages exceed a third reference voltage, wherein the voltage mode driver is disabled when the transmission voltages exceed the third reference voltage, wherein the voltage mode driver comprises multiplexers, NAND gates, NOR gates, an inverter, and driver unit cells, wherein the voltage mode driver receives a differential input signal and outputs to the transmission lines according to controls signals, and wherein the control signals comprise the following: a DisDrv signal that tri-states the voltage mode driver, a RcvDetectEn signal to set the transmission voltages to a high state or low state, and a RcvDetectClr signal to enable the voltage mode driver.

* * * * *